(12) United States Patent
Carpenter et al.

(10) Patent No.: US 6,717,452 B2
(45) Date of Patent: Apr. 6, 2004

(54) LEVEL SHIFTER

(75) Inventors: Gary Dale Carpenter, Pflugerville, TX (US); Kevin John Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/159,484

(22) Filed: May 30, 2002

(65) Prior Publication Data

US 2003/0222699 A1 Dec. 4, 2003

(51) Int. Cl.[7] .................................................. H03L 5/00
(52) U.S. Cl. .......................... 327/333; 327/427; 326/68; 326/81
(58) Field of Search ................................. 327/333, 427, 327/57, 215, 218, 219, 434, 437, 581; 326/68, 80, 81

(56) References Cited

U.S. PATENT DOCUMENTS

| 5,153,451 A | * | 10/1992 | Yamamura et al. ......... 327/333 |
| 5,324,996 A | * | 6/1994 | Mote, Jr. ...................... 326/21 |
| 5,559,996 A | * | 9/1996 | Fujioka ....................... 327/333 |
| 5,680,064 A | * | 10/1997 | Masaki et al. ................. 326/81 |
| 5,917,339 A | * | 6/1999 | Kim ............................. 326/68 |

* cited by examiner

*Primary Examiner*—Long Nguyen
(74) *Attorney, Agent, or Firm*—Kelly K. Kordzik; Winstead Sechrest & Minick P.C.; Casimer K. Salys

(57) ABSTRACT

A level shifter having a data input node, a first inverter having its input connected to the data input node, a second inverter connected to an output of the first inverter, a data output node, a latch having its output connected to the data output node, a first NFET connected between an input of the latch and a ground potential, and having its gate electrode connected to an output of the second inverter, and a second NFET connected between the data output node and the ground potential, and having its gate electrode connected to the output of the first inverter. The level shifter provides for a conversion of a data signal from a power supply domain of 1.8 volts to one of 3.3 volts.

1 Claim, 3 Drawing Sheets

US 6,717,452 B2

LEVEL SHIFTER

TECHNICAL FIELD

The present invention relates in general to data processing systems, and in particular, to the transfer of data signals within integrated circuitry.

BACKGROUND INFORMATION

Level shifting receivers translate signals between two voltage supply domains. For example, receivers may translate signals originating from an integrated circuit operating under a lower supply voltage (e.g., 1.8 volts (V)) to an integrated circuit operating with a higher supply voltage (e.g., 2.5 V). Prior art circuits have also been designed that permit the isolation of the receiver from the removal of the driver supply voltage.

Referring to FIG. 3, there is illustrated prior art level shifter 100, wherein the low-voltage supply is designated as Vdd and the high voltage supply is designated as Vdd_H. The data in input signal is buffered by inverters operating under the lower supply voltage Vdd. The first inverter is comprised of NFET (N-channel field effect transistor) 301 and PFET(P-channel FET) 302, while the second inverter is comprised of PFET 303 and NFET 304. The complementary outputs of these two inverters are driven to pull-down NFETs 305 and 308 with cross-coupled PFETs 306 and 307. This prior art circuit has the disadvantage that it does not preserve valid signal levels in the event that the voltage Vdd is disabled, i.e., either forced to the same potential as the ground or allowed to degrade over time to the ground potential (for example, portable electronic devices employ nonpersisent power supply domains where the voltage supply is removed from the circuitry to preserve battery power). In particular, as the supply degrades toward ground, the nodes at the drain of the cross-coupled PFETs will both rise up to within a threshold voltage of the high voltage supply, Vdd_H.

In addition, as the voltage Vdd is degrading toward ground, one cannot be certain that the inverters powered by Vdd will maintain their relative order: whichever signal amongst the output of the first inverter, formed by devices 301 and 302, and the output of the second inverter, formed by devices 303 and 304, which was initially higher in voltage may, as the supply degrades, become lower in voltage. This change in the relative maximum voltage signal increases power consumption and may cause the output DATA OUT to change state.

When the level shifter is used in an environment where the low voltage supply can be removed, for instance to save power, the level shifter may be augmented with isolation NFETs, such as NFETs 410 and 412 shown in the level shifter 400 of FIG. 4. Such isolation NFETs help prevent transient events during the removal of the Vdd supply from affecting the state of the level shifter. Devices 401–404 operate similarly to devices 301–304; device 409 operates similarly to device 305; devices 406–407 operate similarly to devices 306–307; and device 411 operates similarly to device 308. Prior to the removal of Vdd, the HOLD signal is driven low to isolate the shifter 400. To hold the state of the various signals within the level shifter 400, the cross-coupled NFETs 405 and 408 are added. Thus when Vdd is removed, the state of the level shifter 400 when the HOLD signal is removed is maintained. However, the cascaded NFETs 409/410 and 411/412 limit the performance of the level shifter, primarily limiting the voltage gain range of the output of the shifter. There are two major problems with this prior art circuit due to the cascaded transistors: the cascaded transistors limit the difference between the supplies Vdd_H and Vdd, and because the transistors are cascaded, they must be large which increases circuit area and power consumption.

Thus, there is a need in the art for a level shifter that overcomes the aforementioned deficiencies, thus providing a gain in the active voltage range of the Vdd supply.

SUMMARY OF THE INVENTION

The present invention addresses the foregoing needs by allowing a significantly greater voltage difference between the low and high level power supplies in the implementation of level shifters, and supports the removal of the driver power supply from the low level circuitry while maintaining the integrity of the data signal at the high level circuitry output side. This is accomplished in part by eliminating the cascaded devices in the level shifter.

One embodiment of the present invention is a level shifter comprising a data input node, a first inverter having its input connected to the data input node, a second inverter connected to an output of the first inverter, a data output node, a latch having its output connected to the data output node, a first NFET connected between an input of the latch and a ground potential, and having its gate electrode connected to an output of the second inverter, and a second NFET connected between the data output node and the ground potential, and having its gate electrode connected to the output of the first inverter.

Another embodiment of the present invention is as a data processing system comprising a microprocessor and accompanying circuitry outputting data signals with a voltage swing magnitude of 1.8 volts, level shifter circuitry for converting the voltage swing magnitude of the data signals from 1.8 volts to 3.3 volts, and input/output (I/O) circuitry for receiving the data signals with the voltage swing magnitude of 3.3 volts.

Another embodiment of the present invention is as a level shifter comprising first circuitry for receiving a data signal having a voltage swing from ground to 1.8 volts, and second circuitry for converting the data signal to have a voltage swing from ground to 3.3 volts.

Another embodiment of the present invention is as a level shifter comprising a data input node, a first NOR gate coupled to the data input node, a second NOR gate coupled to an output of the first NOR gate, a storage cell coupled to an output of the second NOR gate, and a data output node coupled to an output of the storage cell.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
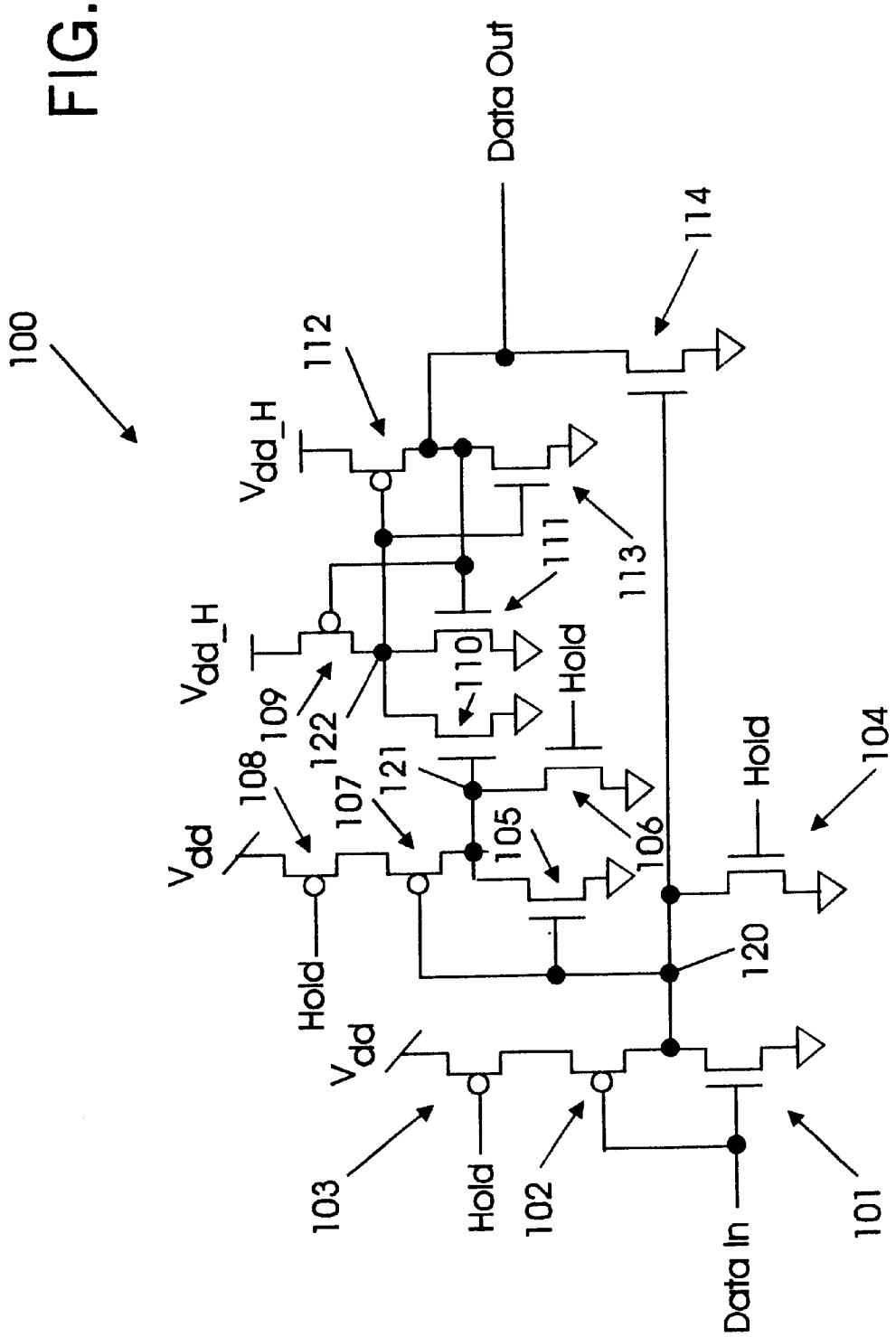
FIG. 1 illustrates a level shifter in accordance with an embodiment of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

The level shifter of the present invention is applicable to circuits in which the internal circuitry is operated at a voltage which is lower than the voltage required for the I/O drivers and receivers, and also where the voltage to the internal circuitry can be disabled to save power, while the I/O drivers and receivers remain powered and maintain the voltages on the off-chip signals.

Figure 2:
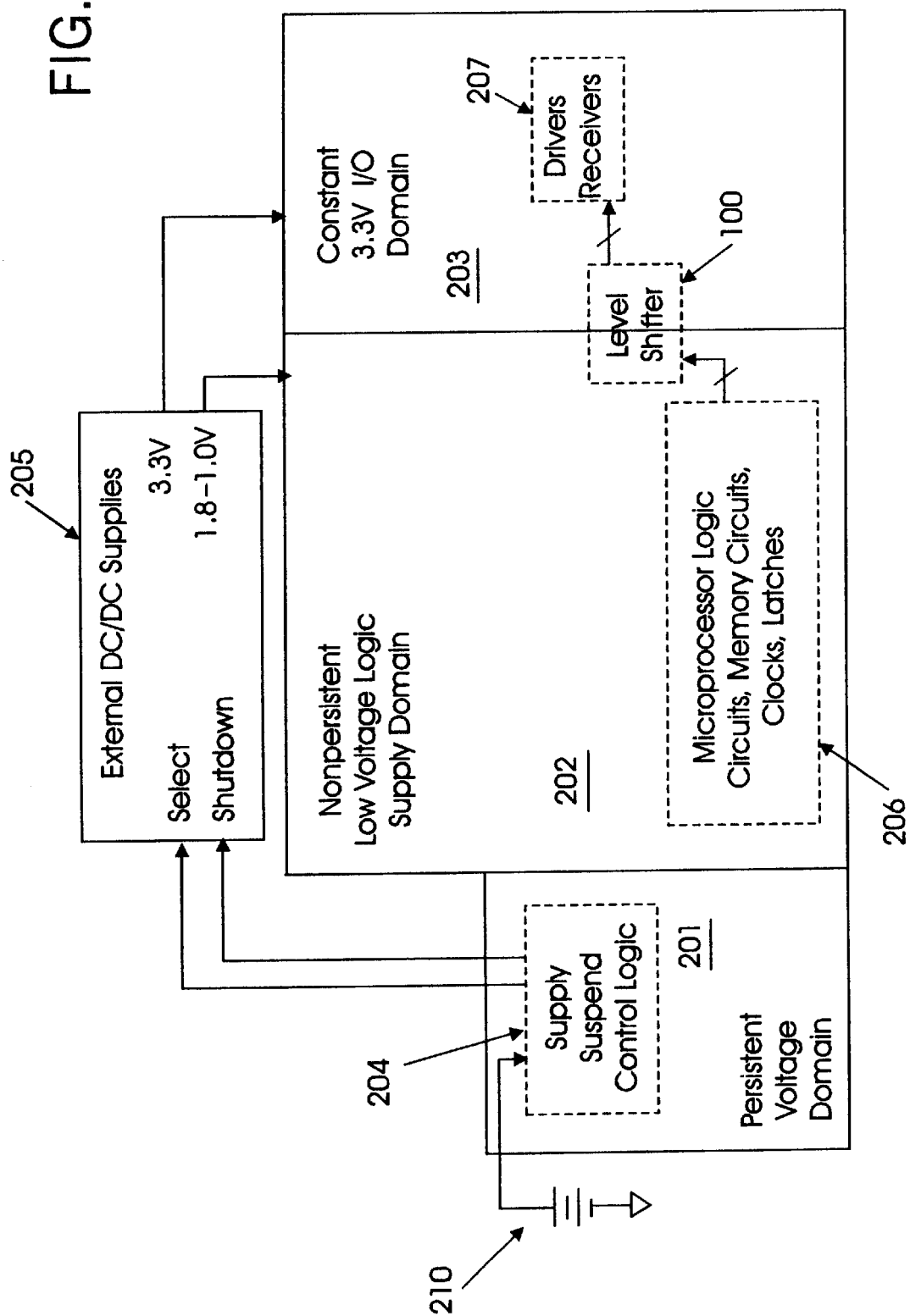
FIG. 2 illustrates data processing circuitry implementing the level shifter of FIG. 1.
Figure 3:
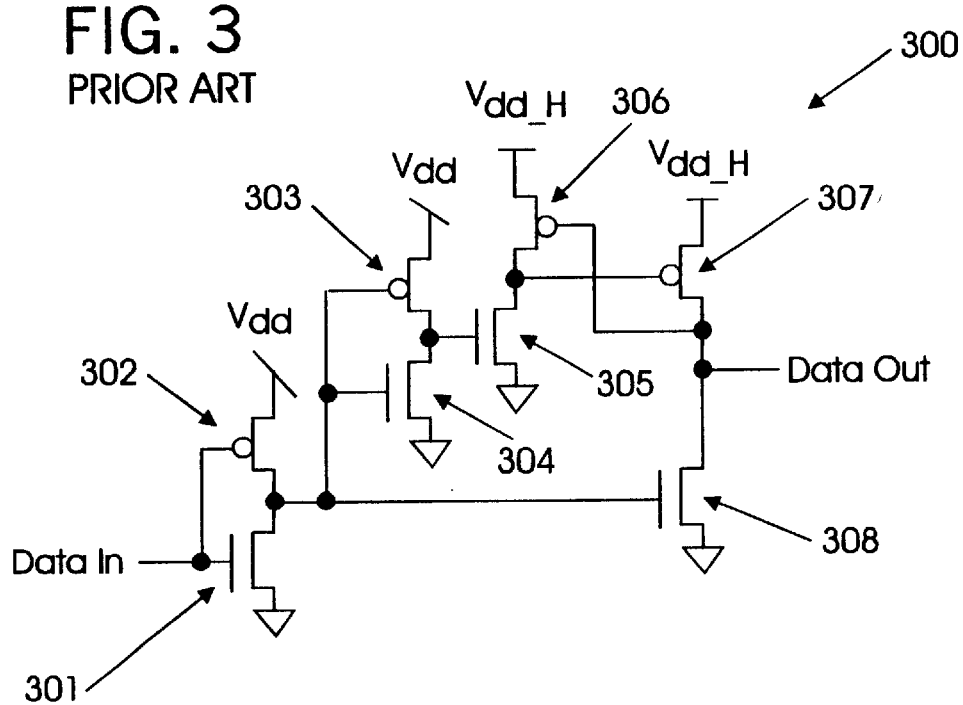
FIG. 3 illustrates a prior art level shifter.
Figure 4:
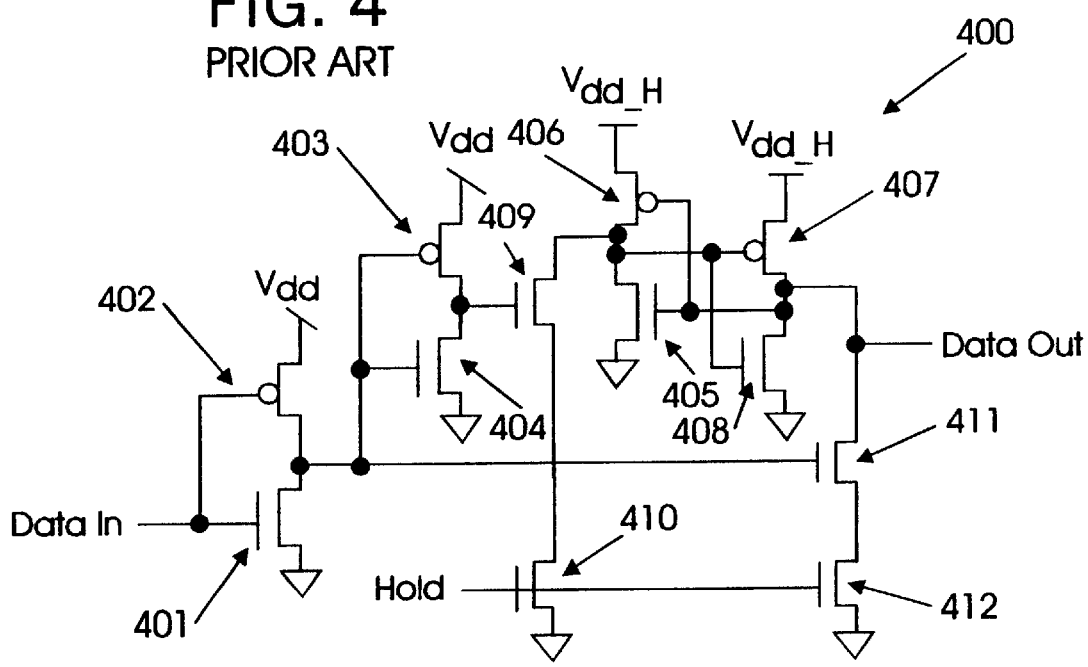
FIG. 4 illustrates another prior art level shifter.

Referring to FIG. 2, a level shifter 100 operates between two different power supply domains. This environment is typical of low-power electronic devices, such as battery-powered devices where conserving energy is particularly important and where the internal logic voltages tend to be low. An exemplary application is shown in FIG. 2, where a microprocessor is used in a battery-powered device, where the internal logic is powered by a supply voltage which can be varied from 1.8 V to 1 V, and is not persistent, and where the I/O drivers and receivers which generate and receive the off-chip signals are powered by a 3.3 V supply voltage. Note that the present invention is not limited to the use in integrated circuitry of such exact power supply voltages, but is applicable where any level shifter is needed. In such devices, it is important that during the removal of the internal logic voltage supply, that the circuit which receives signals from the internal logic domain and translates these signals to the I/O supply domain not generate transient signals or glitches, generate indeterminate output levels, or burn excessive power, which are all possible with the prior art circuits 300 and 400 shown in FIGS. 3 and 4. During the collapse of the internal logic supply voltage when the supply is disabled, the voltage on the given signal may temporarily rise in voltage prior to falling. This temporary rise in voltage level may cause the prior art circuits 300 and 400 to glitch, go indeterminate, or burn power. The present invention, as shown in FIGS. 1 and 2, allows the receiver to continue to generate valid I/O voltage domain outputs when the internal logic domain signals become invalid.

In FIG. 2, a battery 210 supplies power to a supply suspend control logic 204 embodied within a persistent voltage domain 201. In this context, a persistent voltage domain is the collection of all circuitry powered by a voltage which is active at any time in which the device is on; the supply is never switched off, driven to ground, or allowed to degrade below its normal operating range whenever the device is active. Select and shutdown signals are received from the supply suspend control logic 204 by the external DC/DC supplies 205, which supply various voltages to circuits 202 and 203. The Shutdown signal from the supply suspend control logic 204 signals to the external power supply 205 (e.g., DC-to-DC converter) that the power to the logic should be disabled either by forcing the voltage to ground or allowing the voltage level to collapse toward ground over time. The Select signals indicate to the external power supply 205 the voltage level at which the logic supply, Vdd, should be maintained. Circuitry 202 can be referred to as a nonpersistent low voltage logic supply domain implementing circuitry 206 (e.g., microprocessor logic circuits, memory circuits, clocks, latches, etc.). This nonpersistent low voltage supply domain is referred to as such, since the circuits 206 can be turned off for various reasons as described previously. The constant I/O domain 203 implements I/O drivers and receivers 207 for supplying data signals to the off-chip domain. It is typical that such drivers and receivers 207 require higher supply voltages, and thus in this example, a 3.3 V supply is utilized by domain 203, while the lower 1.8–1.0 V supply is used by domain 202.

When data signals are transferred from circuitry 206 to drivers and receivers 207, there is a need for level shifters 100 to transfer the data from the lower voltage supply domain to the higher voltage supply domain. And, as discussed above, there may be a need for these level shifters 100 to operate under conditions where power is terminated from the low voltage logic supply domain 202.

Referring to FIG. 1, there is illustrated level shifter 100 in further detail. Devices 101, 104, 105, 106, 110, 111, 113, and 114 are NFET CMOS (complementary metal-oxide semiconductor) devices, while devices 102, 103, 107, 108, 109, and 112 are PFET CMOS devices. However, the present invention may also be utilized with other types of switching circuits with equivalent functionality.

PFETs 102 and 103 and NFETs 101 and 104 form a NOR gate. When HOLD is high, the output node 120 of this gate is held low. When HOLD is low, the output node 120 of the gate is the logical inversion of the input DATA IN. PFETs 107 and 108 and NFETs 105 and 106 form a NOR gate. When HOLD is high, the output node 121 of this gate is held low. When HOLD is low, the output node 121 of the gate has the same value as the signal DATA IN. PFETs 109 and 112 and NFETs 111 and 113 form a cross-coupled inverter which is a storage cell. When HOLD is high, both NOR gates have a low output value, NFETs 110 and 114 are off, and the cross-coupled inverter maintains the state of the output DATA OUT. When HOLD is low and the output node 120 of the NOR formed by NFETs 101 and 104 and PFETs 102 and 103 is high, NFET 114 is turned on and the output DATA OUT is pulled low. The inverter formed by NFET 111 and PFET 109 reinforces this condition. When HOLD is low and the output node 121 of the NOR formed by NFETs 105 and 106 and PFETs 107 and 108 is high, NFET 110 is turned on and the input node 122 to the inverter formed by PFET 112 and NFET 113 is driven low, and the output DATA OUT is driven high. The inverter formed by NFET 111 and PFET 109 reinforces this condition.

In either instance, if the Vdd power supply is to be removed, first the HOLD signal is activated to a high state. This effectively isolates level shifter 100 from the Vdd power supply and isolates the low power circuits from the higher power supply circuits, and in turn maintaining the state of the data signal present in the level shifter.

Although the present invention and its advantages have been described in detail, it should be understood that various changes, substitutions and alterations can be made herein without departing from the spirit and scope of the invention as defined by the appended claims.

What is claimed is:

1. A level shifter comprising:

a data input node for receiving a data signal at a first voltage level into the level shifter;

a first NFET having a gate electrode connected to the data input node, and a first terminal connected to a ground potential;

a first PFET having a gate electrode connected to the data input node, and a first terminal connected to a second terminal of the first NFET;

a second PFET having a first terminal connected to a second terminal of the first PFET, a second terminal connected to a voltage supply of the first voltage level, and a gate electrode receiving a hold signal;

a second NFET having a gate electrode connected to the second terminal of the first NFET, and a first terminal connected to the ground potential;

a third PFET having a gate electrode connected to the second terminal of the first NFET, and a first terminal connected to a second terminal of the second NFET;

a fourth PFET having a first terminal connected to a second terminal of the third PFET, a second terminal connected to the voltage supply of the first voltage level, and a gate electrode receiving the hold signal;

a third NFET having a gate electrode receiving the hold signal, a first terminal connected to the ground potential, and a second terminal connected to the second terminal of the first NFET;

a fourth NFET having a gate electrode receiving the hold signal, a first terminal connected to the ground potential, and a second terminal connected to the second terminal of the second NFET;

a fifth NFET having a gate electrode connected to the second terminal of the second NFET, and a first terminal connected to the ground potential;

a sixth NFET having a first terminal connected to the ground potential, and a second terminal connected to a second terminal of the fifth NFET;

a fifth PFET having a first terminal connected to a voltage supply of a second voltage level different than the first voltage level, and a second terminal connected to the second terminal of the fifth NFET;

a seventh NFET having a first terminal connected to the ground potential, and a gate electrode connected to the second terminal of the fifth NFET;

a sixth PFET having a first terminal connected to the voltage supply of the second voltage level, and a gate electrode connected to the second terminal of the fifth NFET;

a data output node for outputting a data signal at the second voltage level from the level shifter, the data output node connected to second terminals of the sixth PFET and the seventh NFET, wherein the data signal at the second voltage level corresponds to the data signal at the first voltage level; and an eighth NFET having a gate electrode connected to the second terminal of the first NFET, a first terminal connected to the ground potential, and a second terminal connected to the data output node.

* * * * *